(12) United States Patent
Koo et al.

(10) Patent No.: US 11,455,120 B2
(45) Date of Patent: Sep. 27, 2022

(54) MEMORY SYSTEM AND OPERATING METHOD THEREOF

(71) Applicant: SK hynix Inc., Gyeonggi-do (KR)

(72) Inventors: Duck-Hoi Koo, Gyeonggi-do (KR); Yong-Tae Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 51 days.

(21) Appl. No.: 17/060,380

(22) Filed: Oct. 1, 2020

(65) Prior Publication Data

US 2021/0019080 A1 Jan. 21, 2021

Related U.S. Application Data

(63) Continuation of application No. 16/218,809, filed on Dec. 13, 2018, now Pat. No. 10,802,751.

(30) Foreign Application Priority Data

Jun. 5, 2018 (KR) .................. 10-2018-0064855

(51) Int. Cl.
*G06F 12/00* (2006.01)
*G06F 3/06* (2006.01)
*G06F 12/02* (2006.01)
*G11C 11/56* (2006.01)

(52) U.S. Cl.
CPC ............ *G06F 3/0658* (2013.01); *G06F 3/064* (2013.01); *G06F 3/0659* (2013.01); *G06F 12/0246* (2013.01); *G11C 11/5628* (2013.01); *G11C 11/5642* (2013.01)

(58) Field of Classification Search
CPC ...... G06F 3/0658; G06F 3/064; G06F 3/0659; G06F 12/0246; G11C 11/5628; G11C 11/5642
See application file for complete search history.

(56) References Cited

U.S. PATENT DOCUMENTS

2018/0151251 A1* 5/2018 Oh .................. G11C 29/76

\* cited by examiner

*Primary Examiner* — Shawn X Gu
(74) *Attorney, Agent, or Firm* — IP&T Group LLP

(57) ABSTRACT

A memory system may include: a memory device comprising a plurality of channels, a plurality of dies coupled to the respective channels, and a plurality of super blocks; and a controller suitable for controlling the memory device, wherein the controller includes: a detector suitable for searching for a first available reserved block in a first die, when a bad block has occurred in the first die which is coupled to a first channel and belongs to a first super block group, and searching for a second available reserved block in a second die which is coupled to the first channel and belongs to a second super block group when the first available reserved block is not present in the first die; and an assignor suitable for replacing the bad block with the second available reserved block when the second available reserved block is present.

20 Claims, 11 Drawing Sheets

MEMORY SYSTEM AND OPERATING METHOD THEREOF

CROSS-REFERENCE TO RELATED APPLICATIONS

This application is a continuation of U.S. patent application Ser. No. 16/218,809 filed on Dec. 13, 2018, now issued as U.S. Pat. No. 10,802,751, which claims benefits of priority of Korean Patent Application No. 10-2018-0064855 filed on Jun. 5, 2018. The disclosure of each of the foregoing application is incorporated herein by reference in its entirety.

BACKGROUND

1. Field

Various embodiments of the present invention generally relate to a memory system. Particularly, exemplary embodiments relate to a memory system capable of efficiently searching for a reserved block for replacing a bad block, and an operating method thereof.

2. Description of the Related Art

The computer environment paradigm has moved towards ubiquitous computing, which enables computing systems to be used anytime and anywhere. As a result, the demand for portable electronic devices, such as mobile phones, digital cameras, and laptop computers have increased rapidly. Those electronic devices generally include a memory system using a memory device as a data storage device. The data storage device may be used as a main memory unit or an auxiliary memory unit of a portable electronic device.

Since there is no mechanical driving part, a data storage device using a memory device provides advantages such as excellent stability and durability, high information access speed, and low power consumption. Also, the data storage device can have a quicker data access rate with lower power consumption than that of the hard disk device. Non-limiting examples of the data storage device having such advantages include Universal Serial Bus (USB) memory devices, memory cards of diverse interfaces, Solid-State Drives (SSD) and the like.

SUMMARY

Various embodiments of the present invention are directed to a memory system capable of efficiently replacing a bad block to a reserved block while keeping a parallelism of data process.

In accordance with an embodiment of the present invention, a memory system may include: a memory device comprising a plurality of channels, a plurality of dies coupled to the respective channels, and a plurality of super blocks; and a controller suitable for controlling the memory device, wherein the controller includes: a detector suitable for searching for a first available reserved block in a first die, when a bad block has occurred in the first die which is coupled to a first channel and belongs to a first super block group, and searching for a second available reserved block in a second die which is coupled to the first channel and belongs to a second super block group when the first available reserved block is not present in the first die; and an assignor suitable for replacing the bad block with the second available reserved block when the second available reserved block is present.

In accordance with an embodiment of the present invention, an operating method of a memory system may include: searching for a first available reserved block in a first die, when a bad block has occurred in the first die which is coupled to a first channel and belongs to a first super block group; searching for a second available reserved block in a second die which is coupled to the first channel and belongs to a second super block group when the first available reserved block is not present in the first die; and replacing the bad block with the second available reserved block when the second available reserved block is present.

In accordance with an embodiment of the present invention, a memory system may include: a memory device including first to fourth die groups each having a data block group and a reserved block group, wherein the first and second die groups are coupled to a first channel and the third and fourth die groups are coupled to a second channel, and wherein memory blocks of the first and third die groups form a first group of super blocks and memory blocks of the second and fourth die groups form a second group of super blocks; and a controller suitable for replacing, when a bad block is detected in the first die group, the bad block with a reserved block included in the reserved block group of the die groups in an order of the first die group, the second die group and the fourth die group.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
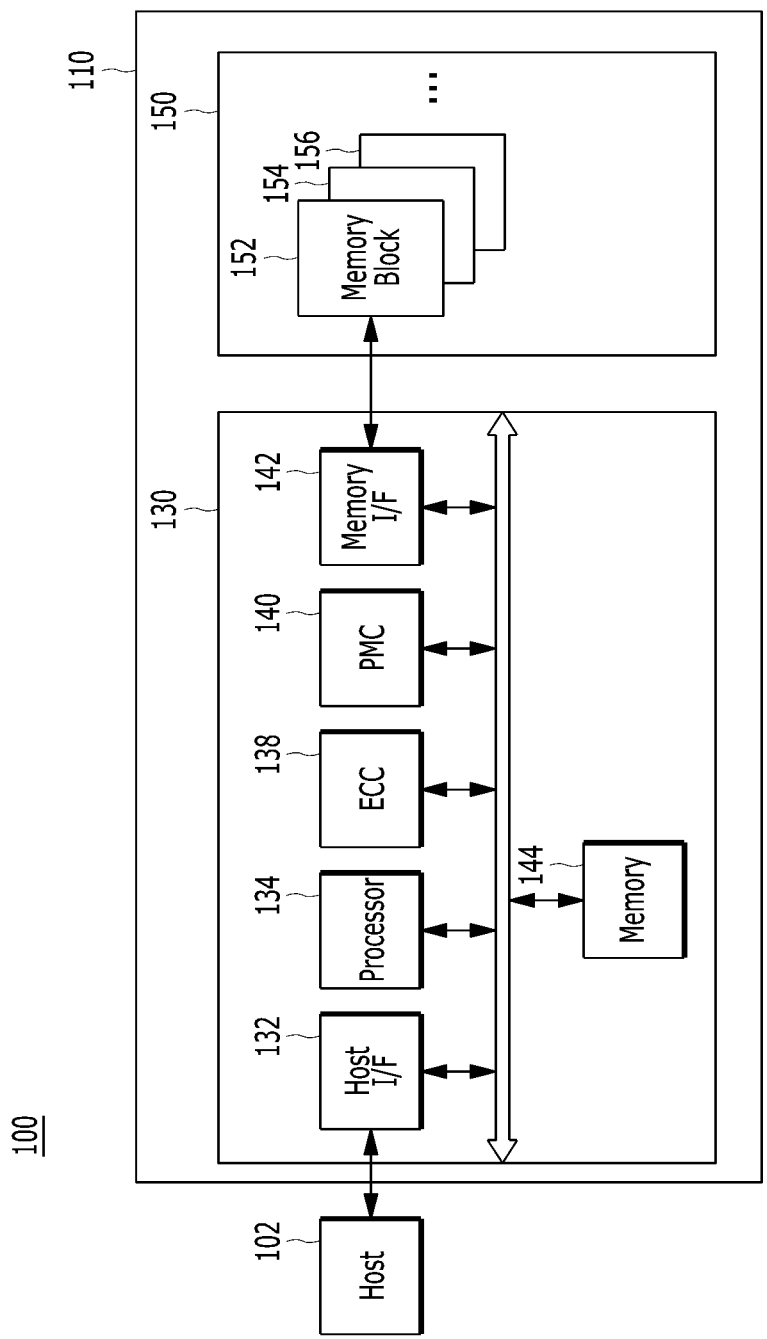
FIG. 1 is a block diagram illustrating a data processing system including a memory system in accordance with an embodiment of the present disclosure.

Various examples of the disclosure are described below in more detail with reference to the accompanying drawings. The disclosure may be embodied in different other embodiments, forms and variations thereof and should not be construed as being limited to the embodiments set forth herein. Rather, the described embodiments are provided so that this disclosure will be thorough and complete, and will fully convey the disclosure to those skilled in the art to which this invention pertains. Throughout the disclosure, like reference numerals refer to like parts throughout the various figures and examples of the disclosure. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player and a laptop computer or an electronic device such as a desktop computer, a game player, a television (TV), a projector and the like.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such, for example, as a dynamic random access memory (DRAM) and a static RAM (SRAM) and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102, and the controller 130 may control storage of data in the memory device 150.

The controller 130 and the memory device 150 may be integrated into a single semiconductor device, which may be included in the various types of memory systems as exemplified above.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while an electrical power is not supplied. The memory device 150 may store data provided from the host 102 through a write operation, and provide data stored therein to the host 102 through a read operation. The memory device 150 may include a plurality of memory blocks 152 to 156, each of the memory blocks 152 to 156 may include a plurality of pages. Each of the plurality of pages may include a plurality of memory cells to which a plurality of word lines (WL) are electrically coupled.

The controller 130 may control overall operations of the memory device 150, such as read, write, program and erase operations. For example, the controller 130 may control the memory device 150 in response to a request from the host 102. The controller 130 may provide the data, read from the memory device 150, with the host 102, and/or may store the data, provided by the host 102, into the memory device 150.

The controller 130 may include a host interface (I/F) 132, a processor 134, an error correction code (ECC) component 138, a power management unit (PMU) 140, a memory interface (I/F) 142, and a memory 144 all operatively coupled via an internal bus.

The host interface 132 may process commands and data provided from the host 102, and may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE).

The ECC unit 138 may detect and correct errors in the data read from the memory device 150 during the read operation. When the number of the error bits is greater than or equal to a threshold number of correctable error bits, the ECC unit 138 may not correct error bits but may output an error correction fail signal indicating failure in correcting the error bits.

The ECC component 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. However, the ECC component 138 is not limited to these error correction techniques. Accordingly, the ECC component 138 may include all circuits, modules, systems or devices for error correction.

The PMU 140 may provide and manage power of the controller 130.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134, in a case when the memory device 150 is a flash memory and, in particular, when the memory device 150 is a NAND flash memory.

The memory 144 may serve as a working memory of the memory system 110 and the controller 130, and may store temporary or transactional data for operating or driving the memory system 110 and the controller 130. The controller 130 may control the memory device 150 in response to a request from the host 102. The controller 130 may deliver data read from the memory device 150 into the host 102, may store data entered through the host 102 within the memory device 150. The memory 144 may be used to store data required for the controller 130 and the memory device 150 in order to perform these operations.

The memory 144 may be implemented with a volatile memory. The memory 144 may be implemented with a static random access memory (SRAM) or a dynamic random access memory (DRAM). Although FIG. 1 exemplifies the memory 144 disposed within the controller 130, the disclosure is not limited thereto. That is, the memory 144 may be located inside or outside the controller 130. For instance, the memory 144 may be embodied by an external volatile memory having a memory interface transferring data and/or signals transferred between the memory 144 and the controller 130.

The processor 134 may control the overall operations of the memory system 110. The processor 134 may drive or execute a firmware to control the overall operations of the memory system 110. The firmware may be referred to as a flash translation layer (FTL).

A FTL may perform an operation as an interface between the host 102 and the memory device 150. The host 102 may transmit requests for write and read operations to the memory device 150 through the FTL.

The FTL may manage operations of address mapping, garbage collection, wear-leveling and so forth. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, through the address mapping operation based on the map data, when the controller 130 updates data of a particular page, the controller 130 may program new data on another empty page and may invalidate old data of the particular page due to a characteristic of a flash memory device. Further, the controller 130 may store map data of the new data into the FTL.

The processor 134 may be implemented with a microprocessor or a central processing unit (CPU). The memory system 110 may include one or more processors 134.

A management unit (not shown) may be included in the processor 134. The management unit may perform bad block management of the memory device 150. The management unit may find bad memory blocks included in the memory device 150, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 100, and thus reliable bad block management is required.

Figure 2:
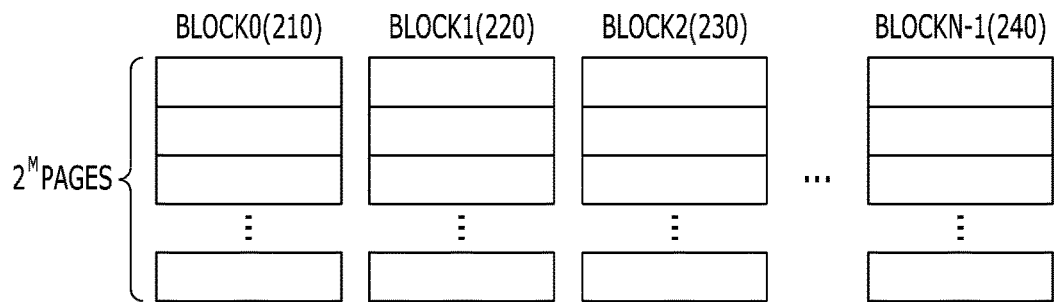
FIG. 2 is a schematic diagram illustrating an exemplary configuration of a memory device of the memory system shown in FIG. 1.

FIG. 2 is a schematic diagram illustrating the memory device 150.

Referring to FIG. 2, the memory device 150 may include the plurality of memory blocks BLOCK 0 to BLOCKN−1 (denoted as 210 to 240), and each of the blocks BLOCK 0 to BLOCKN−1 may include a plurality of pages, for example, $2^M$ pages, the number of which may vary according to circuit design. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Figure 3:
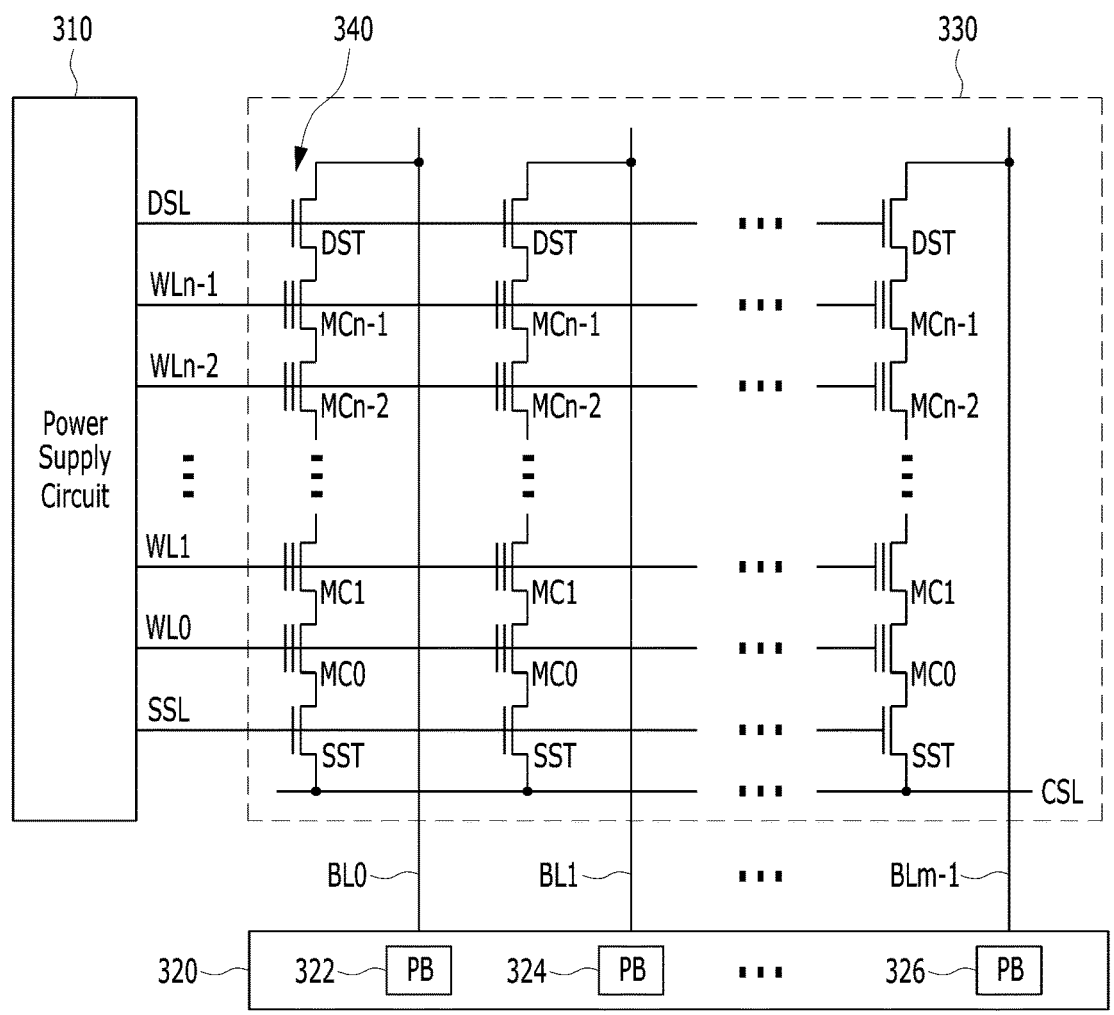
FIG. 3 is a circuit diagram illustrating an exemplary configuration of a memory cell array of a memory block in the memory device shown in FIG. 2.

FIG. 3 is a circuit diagram illustrating a memory block 330 in the memory device 150.

Referring to FIG. 3, the memory block 330 may correspond to any of the plurality of memory blocks 152 to 156 included in the memory device 150 of the memory system 110.

Referring to FIG. 3, the memory block 330 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by single level cells (SLC) each of which may store 1 bit of information, or by multi-level cells (MLC) each of which may store data information of a plurality of bits. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 only shows, as an example, that the memory block 330 is constituted with NAND flash memory cells, it is to be noted that the memory block 330 of the memory device 150 according to the embodiment is not limited to a NAND flash memory. The memory block 330 may be realized by a NOR flash memory, a hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply circuit 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The power supply circuit 310 may perform a voltage generating operation under the control of a control circuit (not shown). The power supply circuit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read and write (read/write) circuit 320 of the memory device 150 may be controlled by the control circuit, and may serve as a sense amplifier or a write driver according to an operation mode. During a verification operation or a normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
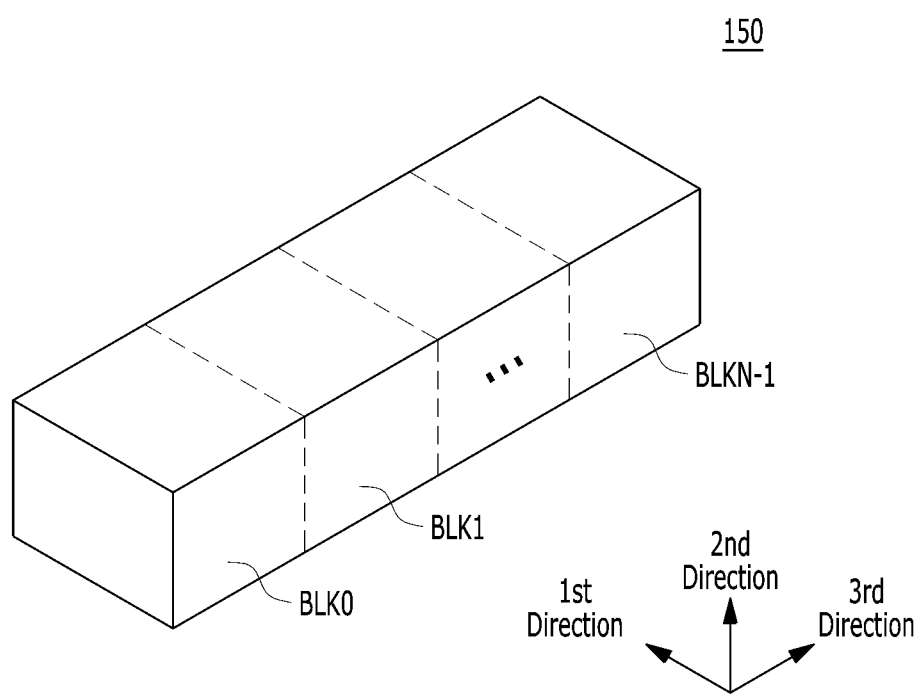
FIG. 4 is a schematic diagram illustrating an exemplary three-dimensional structure of the memory device shown in FIG. 2.

FIG. 4 is a schematic diagram illustrating a 3D structure of the memory device 150.

Although FIG. 4 shows a 3D structure, the memory device 150 may be embodied by a two-dimensional (2D) or three-dimensional (3D) memory device. Specifically, as illustrated in FIG. 4, the memory device 150 may be embodied in a nonvolatile memory device having a 3D stack structure. When the memory device 150 has a 3D structure, the memory device 150 may include a plurality of memory blocks BLK0 to BLKN−1 each having a 3D structure (or a vertical structure).

A nonvolatile memory device may include a plurality of channels, chip enable (CE) pins assigned to each of the channels, a plurality of dies assigned to each of the CE pins, a plurality of planes assigned to each of the dies, and a plurality of data blocks.

The nonvolatile memory device may set a super block and stripe as a unit of data process, in order to efficiently process data. The super block may indicate a group of data blocks located at the same offset in planes of a plurality of dies. The stripe may indicate a group of pages located at the same offset in one super block. That is, an erase operation or garbage collection operation may be performed on a super block basis, and a read/write operation may be performed on a stripe basis. The sizes of the super block and the stripe may be vary depending on design.

Due to its characteristic, the nonvolatile memory device, for example, a flash memory device, may process data at lower speed than a volatile memory device. In order to compensate for the lower data processing speed than the volatile memory device, the nonvolatile memory device may have an ability to process a plurality of data at one time. That is, maintaining the parallelism of data processing operations to simultaneously process different data through a plurality of channels may serve as an important factor in determining the performance of the nonvolatile memory device. For example, the parallelism of the channels and the parallelism of the CE pins can maintain the parallelism of the data processing operations.

The parallelism of the channels may indicate that read/write operations can be separately performed on different channels while the plurality of channels do not affect one another. For example, when read data are stored only in a memory block within a die coupled to a first channel, the read operation may have no influence on the write operation performed in a memory block within a die coupled to only a second channel. That is, the parallelism of the channels can be maintained. On the other hand, when read data are stored in a memory block within a die coupled to the first channel and a memory block within a die coupled to the second channel, the write operation to be performed in the second channel may be on hold in order to read the read data through the second channel. At this time, the parallelism of the channels may not be maintained.

The parallelism of the CE pins may indicate that the plurality of dies can process data while not affecting one another. For example, when it is assumed that two dies are assigned to each of the CE pins, each of the two dies allocated to the CE pin needs to be separately utilized in order to efficiently process data. At this time, the parallelism of the CE pins can be maintained. On the other hand, when one of the two dies assigned to the CE pin is continuously maintained in a busy state and the other die is continuously maintained in an idle state, the data processing efficiency may be reduced. That is, when the parallelism of the CE pins is not maintained, the data processing efficiency may be reduced.

As described with reference to FIG. 1, the memory system 110 may manage a bad block which occurs in the memory device 150. In an embodiment, a bad block may be replaced with a reserved block. The reserved block may be assigned to each of the plurality of dies in the nonvolatile memory device. When one or more bad blocks occur in the plurality of data blocks, the reserved block may replace the one or more bad blocks. At this time, however, when an arbitrary reserved block replaces the bad block, the parallelism of data processing may not be maintained. As a result, the read/write performance of the memory system may be degraded.

In order to overcome such a problem, the memory system 110 in accordance with the present embodiment may establish a policy for maintaining the parallelism of the channels and the parallelism of the CE pins. That is, the memory system 110 in accordance with the present embodiment may establish a policy for searching for a reserved block to replace a bad block, and assign a reserved block in place of a bad block, in order to not degrade the performance of the memory system 110.

Figure 5:
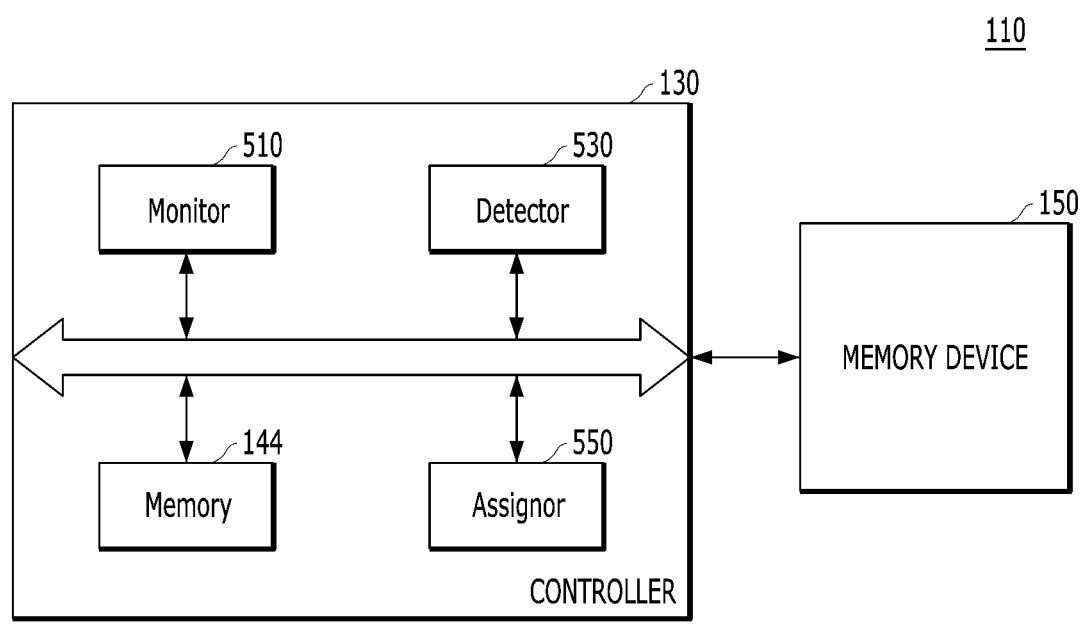
FIG. 5 is a block diagram illustrating the structure of the memory system in accordance with an embodiment of the present disclosure.

FIG. 5 is a block diagram illustrating the structure of the memory system 110 in accordance with the present embodiment.

As described above, the memory device 150 may include the plurality of channels, the CE pins assigned to each of the channels, the plurality of dies assigned to each of the CE pins, the plurality of planes assigned to each of the dies, and the plurality of data blocks. A super block and stripe may be set as the unit of data process in order to efficiently process data in the memory device 150. Furthermore, the memory device 150 may manage, as a super block group, memory blocks within a plurality of dies assigned to a specific number of CE pins assigned to a specific number of channels. For example, the memory device 150 may manage, as a super block group, memory blocks within eight dies assigned to two channels and two CE pins. The super block group may include a plurality of super blocks. A memory block may be a data block or a reserved block.

The controller 130, in addition to the components described with reference to FIG. 1, may include a monitor 510, a detector 530, an assignor 550 and a memory 144.

The monitor 510 may periodically monitor whether a bad block occurs in the memory cell array 330. As described with reference to FIG. 1, the controller 130 may perform the bad block management operation through the processor 134. Therefore, the monitor 510 may be included in the processor 134 illustrated in FIG. 1. The monitor 510 may inform the detector 530 that a bad block has occurred.

The detector 530 may search for an available reserved block to replace the bad block.

First, the detector 530 may search for a first available reserved block present in a die where the bad block is located. Although the reserved block present in the same die replaces the bad block, the super block and the stripe can be maintained. Therefore, the parallelism of data processing can be maintained. Thus, the detector 530 may preferentially search for the reserved block in the same die as the bad block. When the first available reserved block is present, the detector 530 may transfer information on the searched reserved block (for example, address information of the reserved block) to the assignor 550.

On the other hand, when the first available reserved block is not present, the detector 530 may search for a second available reserved block included in a die within another super block group coupled to the same channel. When a reserved block is searched from different super block group from the bad block in the same channel, the parallelism of the channels can be maintained. Therefore, the detector 530 may secondarily search for the available reserved block included in the die within the different super block group coupled to the same channel. When the second available reserved block is searched, the detector 530 may transfer information on the searched reserved block to the assignor 550.

On the other hand, when the second available reserved block is not searched, the detector 530 may search for a third available reserved block included in a die within a super block group, which has different offset from the super block group including the bad block and is coupled to different channel. When a reserved block is searched from a super block group, which has different offset from the super block group including the bad block and is coupled to the different channel, the parallelism of the CE pins can be maintained. Therefore, the detector 530 may thirdly search for the available reserved block included in the die within a super block group, which has different offset from the super block group including the bad block and is coupled to the different channel. When the third available reserved block is searched, the detector 530 may transfer information on the searched reserved block to the assignor 550.

On the other hand, when the third available reserved block is not present, the detector 530 may search for a fourth available reserved block included in an arbitrary die. The detector 530 may transfer information on the searched fourth available reserved block to the assignor 550.

The assignor 550 may replace the bad block with the available reserved block searched through the detector 530. For example, when a bad block has occurred in data blocks included in a super block, the assignor 550 may exclude the bad block from the super block and assign the searched reserved block to maintain the super block. That is, the assignor 550 may update the addresses of the individual memory blocks constituting the super block. The assignor 550 may inform the memory 144 that the bad block was excluded from the super block and the reserved block was newly assigned to maintain the super block.

The memory 144 may store the information on the super block. When the bad block within the super block is replaced with the reserved block, the memory 144 may receive the reserved block assignment information from the assignor 550, and update the information on the super block.

Figure 6:
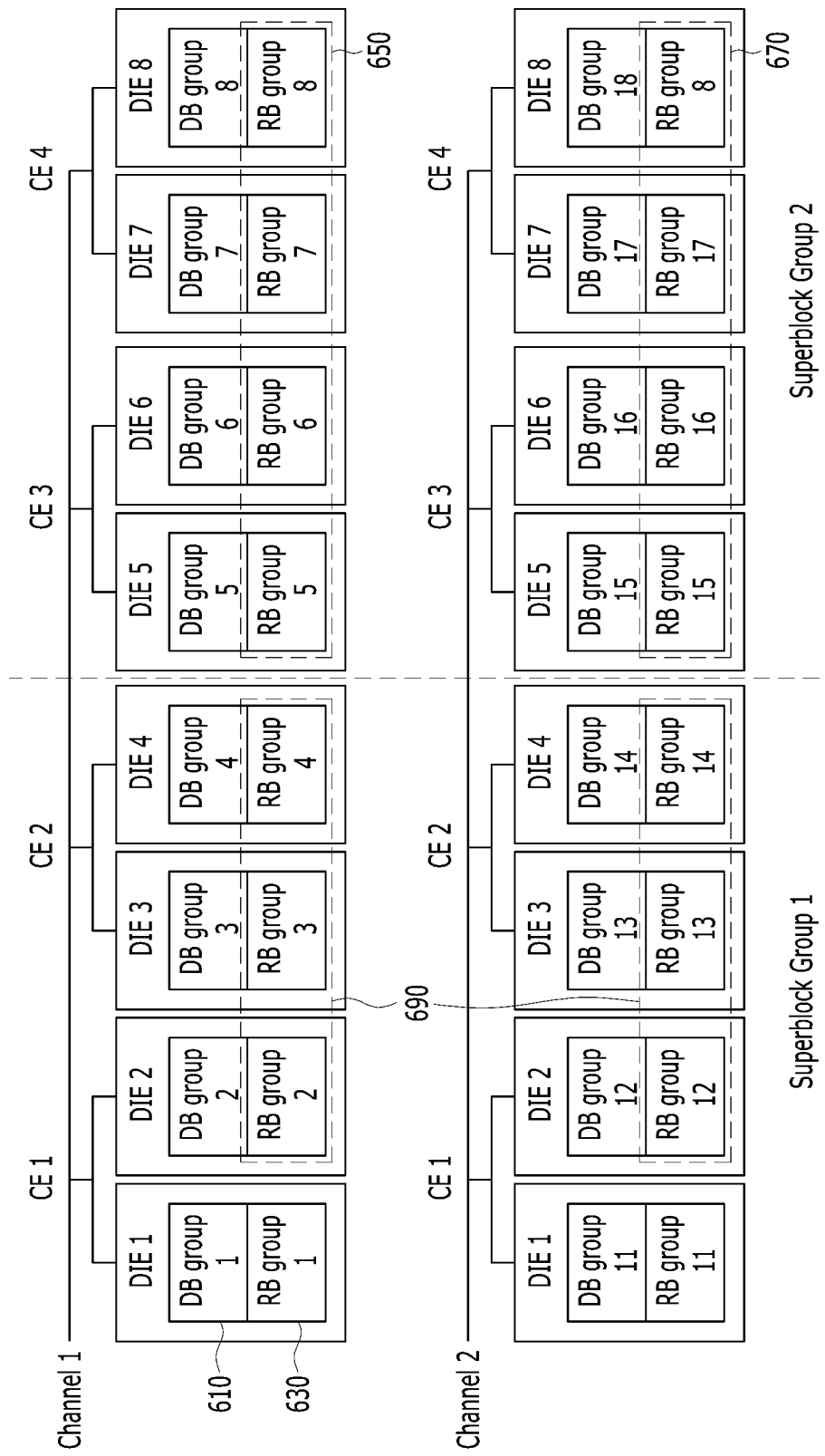
FIG. 6 schematically illustrates the structure of the memory cell array in accordance with the present disclosure.

FIG. 6 schematically illustrates the structure of the memory cell array 330 in accordance with the present embodiment. In particular, the method for searching for an available reserved block in accordance with the present embodiment will be described with reference to FIG. 6. The structure of the memory cell array 330 illustrated in FIG. 6 is only an example, and the present embodiment is not limited thereto.

The memory cell array 330 illustrated in FIG. 6 may include two channels, four CE pins per channel and two dies per CE pin, and each of the dies may include a data block group (denoted as DB group) and a reserved block group (denoted as RB group). The DB group may include a plurality of data blocks, and the RB group may include a plurality of reserved blocks. Furthermore, two channels and two CE pins may be grouped to constitute a super block group Superblock Group including data blocks and reserved blocks which are included in eight dies. FIG. 6 illustrates that first and second super block groups Superblock Groups 1 and 2 are present, and each of the super block groups may include N super blocks. The super block may include blocks located at the same offset in planes of four dies. For example, blocks located at the same offset within the first to fourth data block groups included in the first to fourth dies, respectively, may be set to a super block. Furthermore, pages located at the same offset within the set super block may be set to a stripe. However, the above-described configuration may be set for convenience of description, and the present embodiment is not limited thereto. Hereafter, suppose that a bad block has occurred in a first data block group 610.

The monitor 510 may monitor the bad block within the first data block group 610. The monitor 510 may inform the detector 530 that the bad block has occurred in the first data block group 610.

The detector 530 may search for an available reserved block to replace the bad block which occurred in the first data block group 610.

First, the detector 530 may search for a first available reserved block from a first reserved block group 630 present in the first die where the bad block is located. When the first available reserved block is searched from the first reserved block group 630, the detector 530 may transfer information on the searched first available reserved block (for example, address information) to the assignor 550.

On the other hand, when the first available reserved block is not present, the detector 530 may search for a second available reserved block in fifth to eighth reserved block groups 650 included in fifth to eighth dies within the second super block group coupled to the first channel. When the second available reserved block is searched, the detector 530 may transfer information on the searched second available reserved block to the assignor 550.

On the other hand, when the second available reserved block is not searched, the detector 530 may search for a third available reserved block in 15th to 18th reserved block groups 670 included in 15th to 18th dies within the second super block group coupled to the second channel. When the third available reserved block is searched, the detector 530 may transfer information on the searched third available reserved block to the assignor 550.

On the other hand, when the third available reserved block is not searched, the detector 530 may search for a fourth available reserved block in reserved block groups 690 included in arbitrary dies. The detector 530 may transfer information on the searched fourth available reserved block to the assignor 550.

Through the above-described sequence, the detector 530 may search for the reserved block to replace the bad block.

Figure 7:
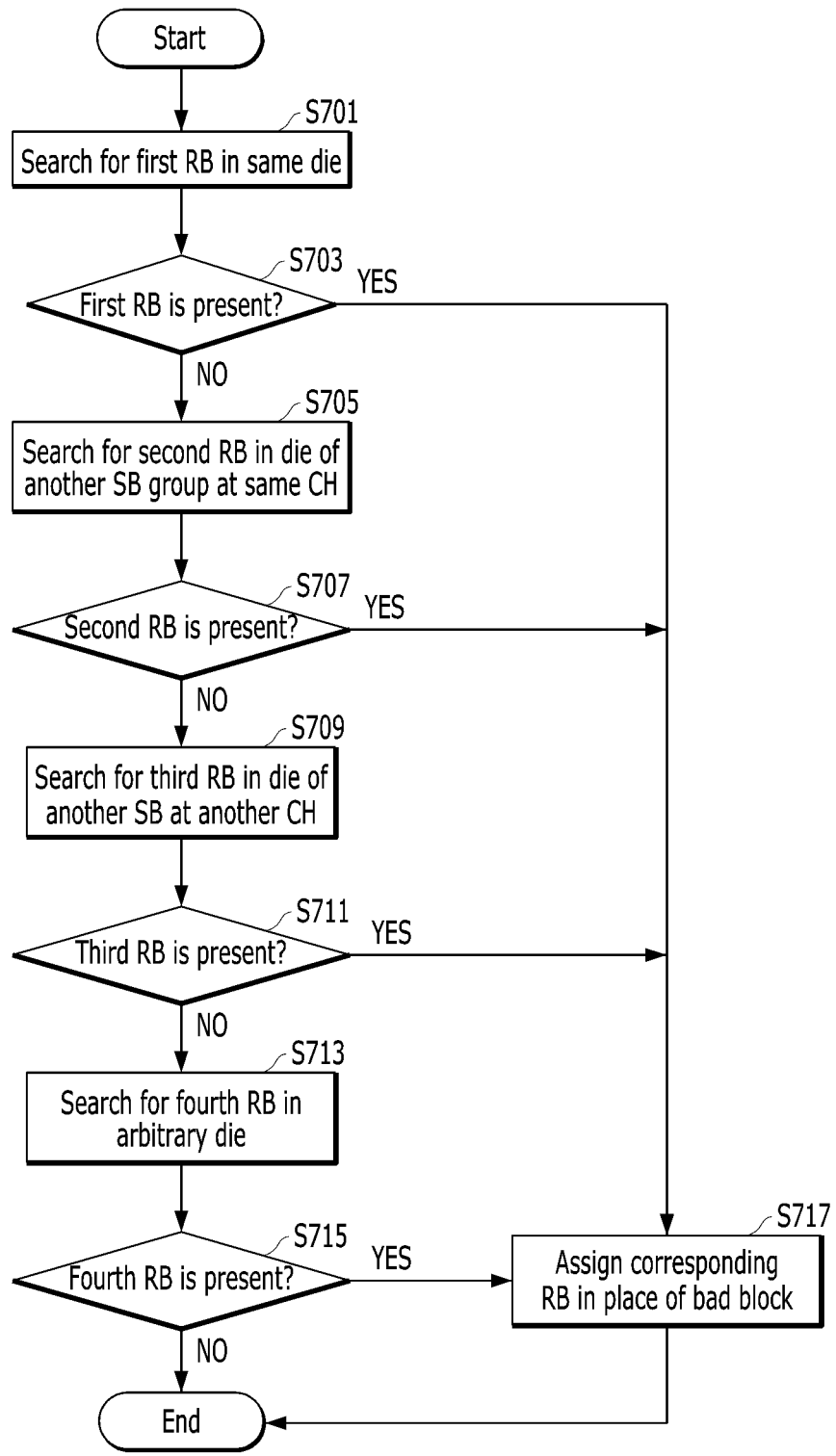
FIG. 7 is a flowchart illustrating an operation process of the controller in accordance with an embodiment of the present disclosure.

FIG. 7 is a flowchart illustrating an operation process of the controller 130 in accordance with an embodiment. In particular, FIG. 7 illustrates a process in which the detector 530 detects a reserved block.

First, at step S701, the detector 530 having recognized an occurrence of bad block may search for a first available reserved block in the reserved block group included in the same die.

When the first available reserved block is searched (that is, "Yes" at step S703), the detector 530 may transfer information on the first available reserved block to the assignor 550, and the assignor 550 may assign the first available reserved block to replace the bad block, at step S717.

On the other hand, when the first available reserved block is not searched (that is, "No" at step S703), the detector 530 may search for a second available reserved block in a reserved block group included in a die coupled to the same channel as the channel coupled to the die where the bad block occurred, but is included in different super block group, at step S705.

When the second available reserved block is searched (that is, "Yes" at step S707), the detector 530 may transfer information on the second available reserved block to the assignor 550, and the assignor 550 may assign the second available reserved block to replace the bad block, at step S717.

On the other hand, when the second available reserved block is not searched (that is, "No" at step S707), the detector 530 may search for a third available reserved block in a reserved block group included in a die which is included in a super block group, which has different offset from the super block group including the bad block and is coupled to a channel different from the channel coupled to the die where the bad block occurred, at step S709.

When the third available reserved block is searched (that is, "Yes" at step S711), the detector 530 may transfer information on the third available reserved block to the assignor 550, and the assignor 550 may assign the second available reserved block to replace the bad block, at step S717.

On the other hand, when the third available reserved block is not searched (that is, "Yes" at step S711), the detector 530 may search for a fourth available reserved block in an arbitrary die at step S713.

When the fourth available reserved block is searched (that is, "Yes" at step S715), the detector 530 may transfer information on the fourth available reserved block to the assignor 550, and the assignor 550 may assign the fourth available reserved block to replace the bad block, at step S717.

On the other hand, when the fourth available reserved block is not searched (that is, "No" at step S715), the bad block cannot be replaced because no available reserved block is present.

The memory system 110 in accordance with the present embodiment can search for a reserved block to replace a bad block through the above-described method, and maintain the parallelism of data processing as much as possible. As a result, although a bad block occurs, the read/write performance of the memory system 110 can be maintained.

Hereinafter, a data processing system and electronic devices which may be constituted with the memory system 110 including the memory device 150 and the controller 130, which are described above by referring to FIGS. 1 to 7, will be described in detail with reference to FIGS. 8 to 16.

FIGS. 8 to 16 are diagrams schematically illustrating application examples of the data processing system of FIGS. 1 to 7 according to various embodiments.

Figure 8:
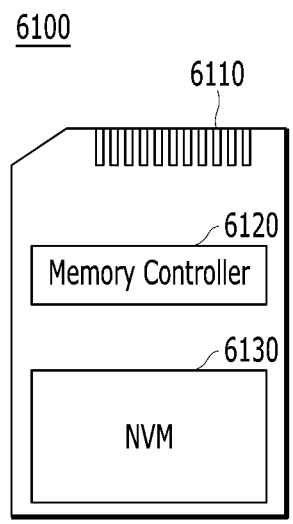
FIGS. 8 to 16 are diagrams schematically illustrating application examples of a data processing system, in accordance with various embodiments of the present invention.

FIG. 8 is a diagram schematically illustrating an example of the data processing system including the memory system in accordance with an embodiment. FIG. 8 schematically illustrates a memory card system 6100 including the memory system in accordance with an embodiment.

Referring to FIG. 8, the memory card system 6100 may include a memory controller 6120, a memory device 6130 and a connector 6110.

More specifically, the memory controller 6120 may be connected to the memory device 6130, and may be configured to access the memory device 6130. The memory device 6130 may be embodied by a nonvolatile memory (NVM). By the way of example but not limitation, the memory controller 6120 may be configured to control read, write, erase and background operations onto the memory device 6130. The memory controller 6120 may be configured to provide an interface between the memory device 6130 and a host (not shown) and/or a drive firmware for controlling the memory device 6130. That is, the memory controller 6120 may correspond to the controller 130 in the memory system 110 described with reference to FIGS. 1 to 7, while the memory device 6130 may correspond to the memory device 150 described with reference to FIGS. 1 to 7.

Thus, as shown in FIG. 1, the memory controller 6120 may include a random access memory (RAM), a processing unit, a host interface, a memory interface and an error correction unit. The memory controller 130 may further include the elements described in FIG. 1.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system in accordance with an embodiment may be applied to wired and/or wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), a secured digital (SD) card (e.g., SD, miniSD, microSD and SDHC) and a universal flash storage (UFS).

Figure 9:
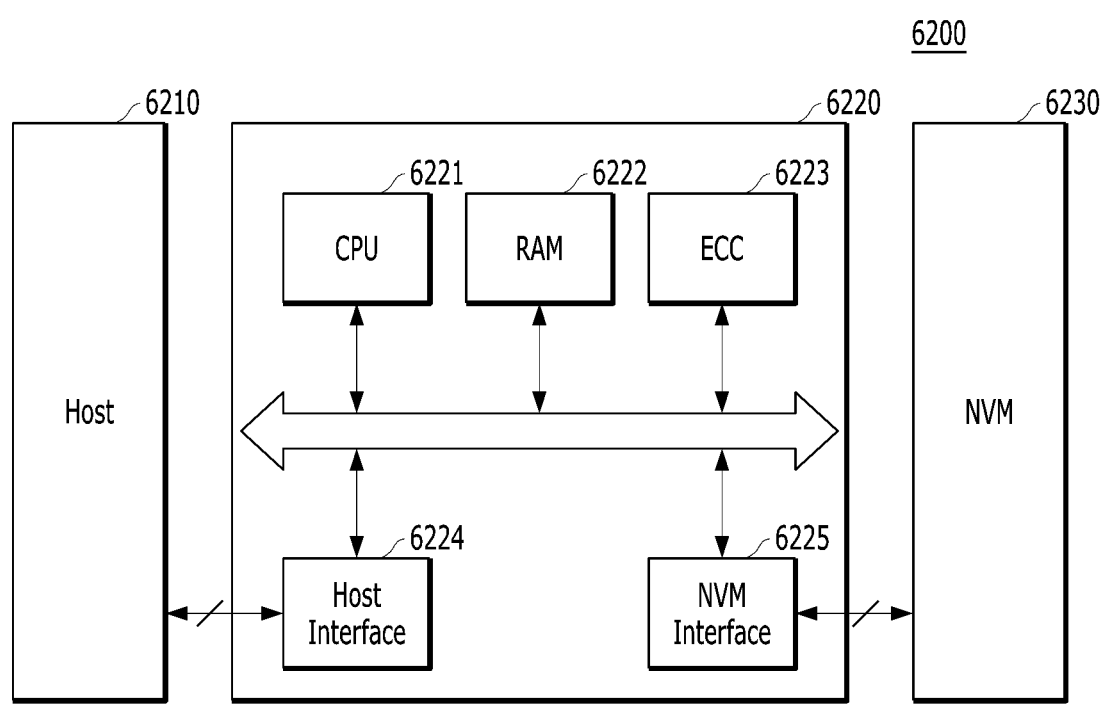

FIG. 9 is a diagram schematically illustrating another example of a data processing system 6200 including a memory system, in accordance with an embodiment.

Referring to FIG. 9, the data processing system 6200 may include a memory device 6230 having one or more nonvolatile memories (NVMs) and a memory controller 6220 for controlling the memory device 6230. The data processing system 6200 may serve as a storage medium such as a memory card (CF, SD, micro-SD or the like) or USB device, as described with reference to FIG. 1. The memory device 6230 may correspond to the memory device 150 in the memory system 110 described in FIGS. 1 to 7, and the memory controller 6220 may correspond to the controller 130 in the memory system 110 described in FIGS. 1 to 7.

The memory controller 6220 may control a read, write, or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC unit 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. in this case, the ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may transmit to, and/or receive from, the host 6210 data or signals through the host interface 6224, and may transmit to, and/or receive from, the memory device 6230 data or signals through the NVM interface 6225. The host interface 6224 may be connected to the host 6210 through a parallel advanced technology attachment (PATA) bus, a serial advanced technology attachment (SATA) bus, a small computer system interface (SCSI), an universal serial bus (USB), a peripheral component inter-connect-express (PCIe), or a NAND interface. The memory controller 6220 may have a wireless communication function with a mobile communication protocol such as wireless fidelity (WiFi) or Long Term Evolution (LTE). The memory controller 6220 may be connected to an external device, e.g., the host 6210, or another external device, and then transmit and/or receive data to and/or from the external device. As the memory controller 6220 is configured to communicate with the external device through one or more of various communication protocols, the memory system and the data processing system in accordance with an embodiment may be applied to wired and/or wireless electronic devices or particularly a mobile electronic device.

Figure 10:
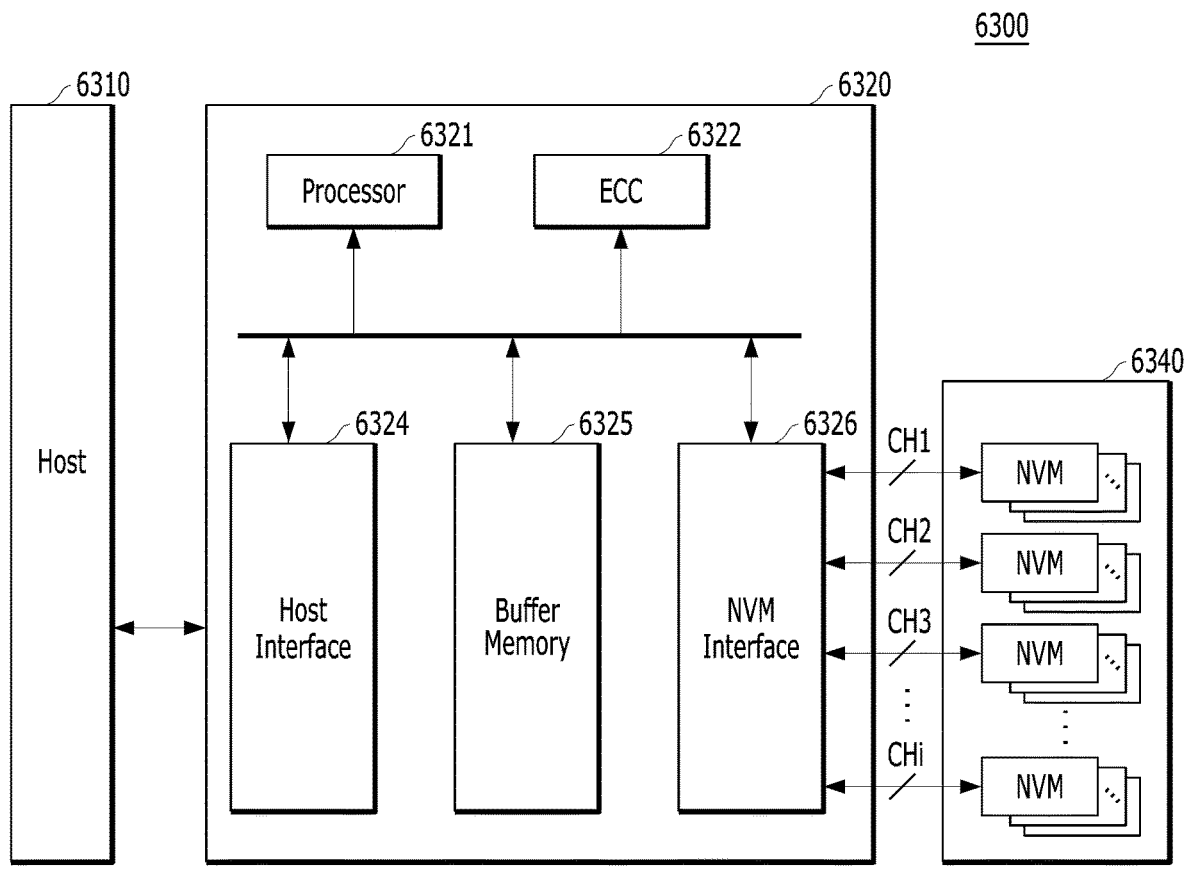

FIG. 10 is a diagram schematically illustrating another example of the data processing system including the memory system in accordance with an embodiment. FIG. 10 schematically illustrates a solid state drive (SSD) to which the memory system in accordance with an embodiment is applied.

Referring to FIG. 10, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). For the purpose of description, FIG. 10 illustrates that the buffer memory 6325 exists in the controller 6320, but the buffer memory 6325 may be located or arranged outside the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, i.e., RAID level information of the write command provided from the host 6310 in the SSDs 6300, and may output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 11:
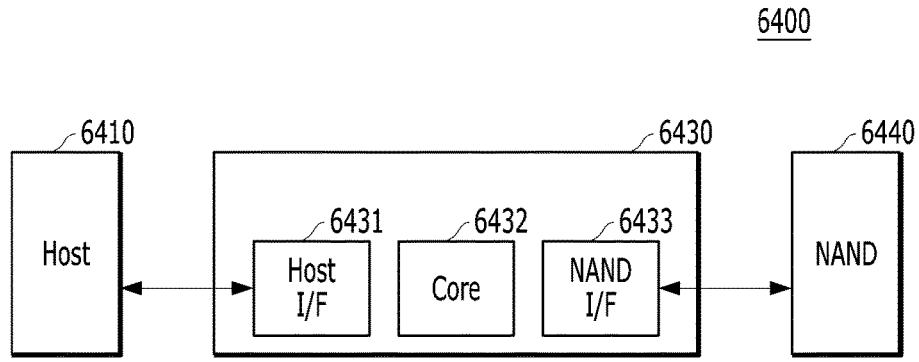

FIG. 11 is a diagram schematically illustrating another example of the data processing system including the memory system in accordance with an embodiment. FIG. 11 schematically illustrates an embedded Multi-Media Card (eMMC) 6400 to which the memory system in accordance with an embodiment is applied.

Referring to FIG. 11, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control the operations of the eMMC 6400, the host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

FIGS. 12 to 15 are diagrams schematically illustrating other examples of the data processing system including the memory system in accordance with an embodiment. FIGS. 12 to 15 schematically illustrate universal flash storage (UFS) systems to which the memory system in accordance with an embodiment is applied.

Referring to FIGS. 12 to 15, the UFS systems 6500, 6600, 6700 and 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired and/or wireless electronic devices or particularly mobile electronic devices, the UFS devices 6520, 6620, 6720, 6820 may serve as embedded UFS devices. The UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700 and 6800 may communicate with external devices, e.g., wired and/or wireless electronic devices or particularly mobile electronic devices through UFS protocols. The UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 9 to 11, and the UFS cards 6530, 6630, 6730, 6830 may be embodied in the form of the memory card system 6100 described with reference to FIG. 8.

Furthermore, in the UFS systems 6500, 6600, 6700 and 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, e.g., universal storage bus (USB) Flash Drives (UFDs), multi-media card (MMC), secure digital (SD), mini-SD, and micro-SD.

Figure 12:
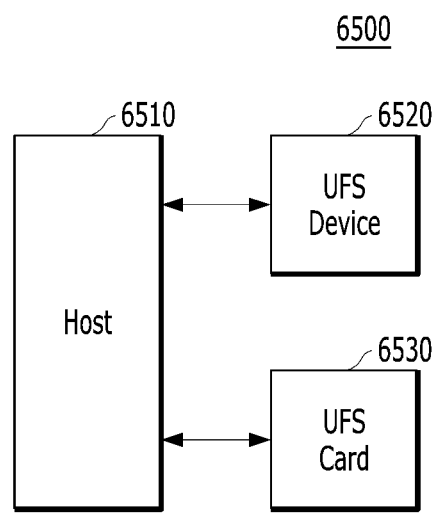

In the UFS system 6500 illustrated in FIG. 12, each of the host 6510, the UFS device 6520 and the UFS card 6530 may include UniPro. The host 6510 may perform a switching operation to communicate with at least one of the UFS device 6520 and the UFS card 6530. The host 6510 may communicate with the UFS device 6520 or the UFS card 6530 through link layer switching, e.g., L3 switching at the UniPro. In this case, the UFS device 6520 and the UFS card 6530 may communicate with each other through a link layer switching at the UniPro of the host 6510. In an example, the configuration in which one UFS device 6520 and one UFS card 6530 are connected to the host 6510 has been exemplified for convenience of description. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520. Herein, the form of a star means an arrangement that a single device is coupled with plural other devices or cards for centralized control.

Figure 13:
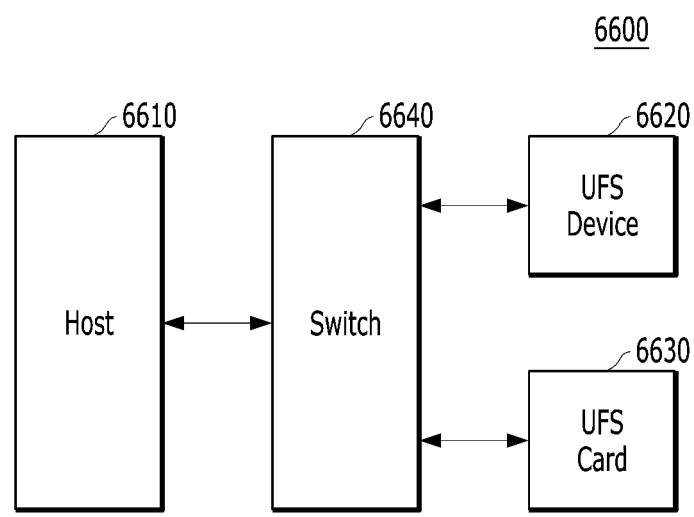

In the UFS system 6600 illustrated in FIG. 13, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an example, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 14:
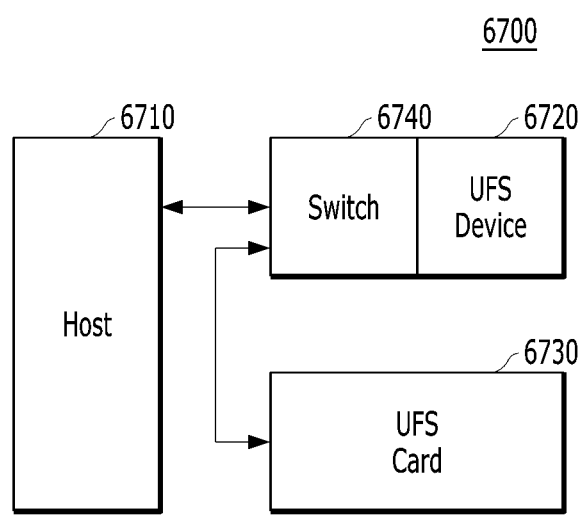

In the UFS system 6700 illustrated in FIG. 14, each of the host 6710, the UFS device 6720 and the UFS card 6730 may include UniPro. The host 6710 may communicate with the UFS device 6720 or the UFS card 6730 through a switching module 6740 performing a switching operation, for example, the switching module 6740 which performs link layer switching at the UniPro, for example, L3 switching. In this case, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an example, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 15:
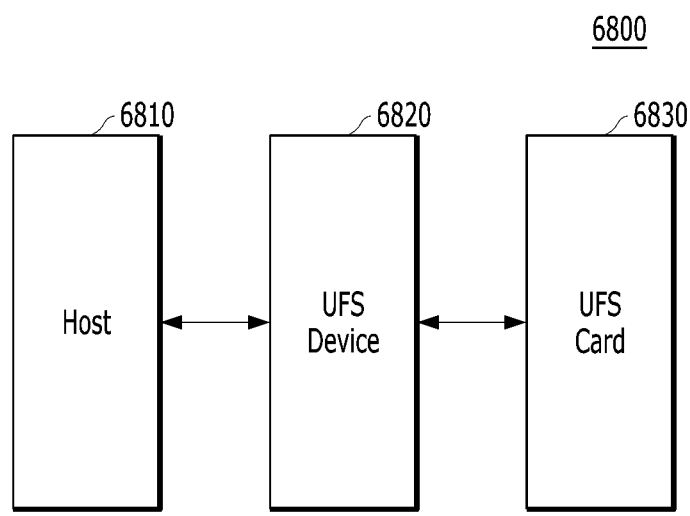

In the UFS system 6800 illustrated in FIG. 15, each of the host 6810, the UFS device 6820 and the UFS card 6830 may include M-PHY and UniPro. The UFS device 6820 may perform a switching operation to communicate with the host 6810 and the UFS card 6830. The UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. Here, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 16:
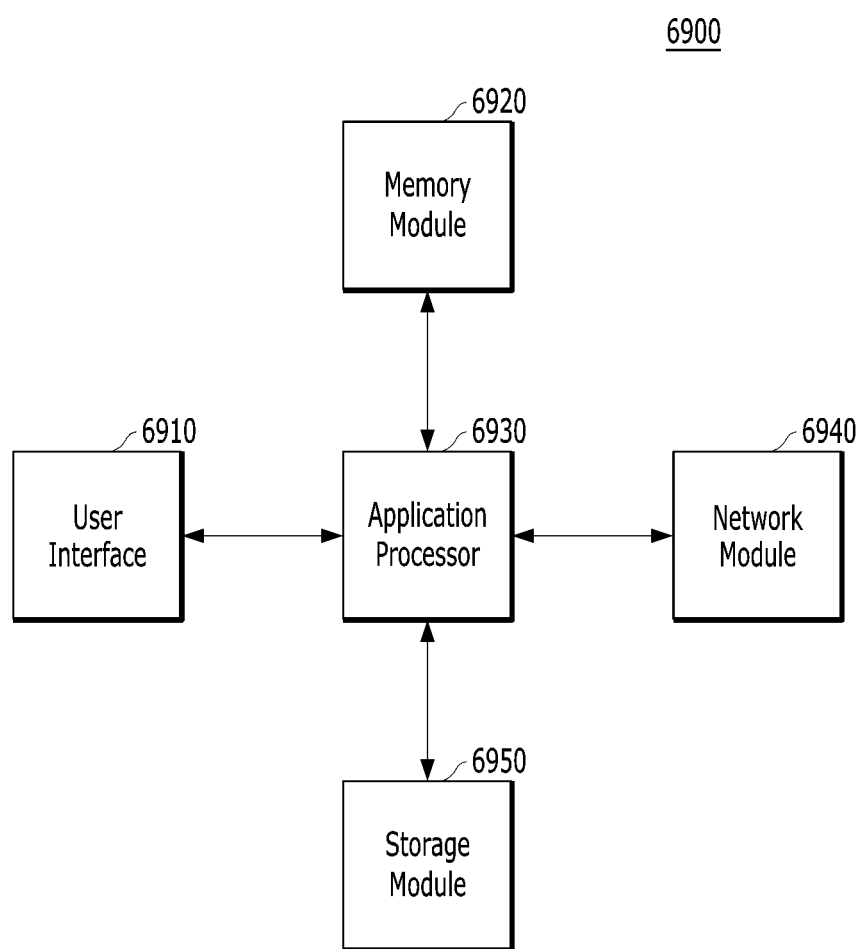

FIG. 16 is a diagram schematically illustrating another example of the data processing system including the memory system in accordance with an embodiment. FIG. 16 is a diagram schematically illustrating a user system 6900 to which the memory system in accordance with an embodiment is applied.

Referring to FIG. 16, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 10 to 15.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired and/or wireless communication with an external device. The user interface 6910 may display data processed by the processor 6930 on a display and touch module of the mobile electronic device, or support a function of receiving data from the touch panel.

While the present invention has been described with respect to specific embodiments, it will be apparent to those skilled in the art that various changes and modifications may be made without departing from the spirit and scope of the invention as determined in the following claims.

What is claimed is:

1. A memory system, comprising:
  a memory device comprising a plurality of super block groups, each super block group including plural memory blocks dispersed in a plurality of dies; and
  a controller coupled to the plural dies through a plurality of channels and configured to determine which memory block in a first die among the plurality of dies is a bad block and determine a reserved memory block which is replaced with the bad block,
  wherein the controller is further configured to search for the reserved memory block in a second die among the plurality of dies, wherein the first die and the second die are coupled to the controller via different channels and belong to different super block groups.

2. The memory system according to claim 1, wherein each channel connects at least two dies among the plurality of dies to the controller, and each of chip enable pins is assigned to the at least two dies.

3. The memory system according to claim 2, wherein the controller is configured to perform plural data input/output operations in parallel based on each of chip enable pins.

4. The memory system according to claim 3, wherein, when a die among the at least two dies is in a busy state, another die among the at least two dies is in an idle state.

5. The memory system according to claim 1, wherein the controller is configured to store information regarding the plurality of super block groups in a memory.

6. The memory system according to claim 1, wherein the controller is configured to periodically monitor whether a bad block occurs.

7. The memory system according to claim 1, wherein each die among the plurality of dies includes a plurality of planes, each plane including at least two memory blocks.

8. The memory system according to claim 7, wherein the plural memory blocks included in each super block group are located at a same offset in each die before any memory block of the plural memory blocks is replaced with the reserved memory block.

9. The memory system according to claim 8, wherein the reserved memory block and the bad block are located at different offsets in different dies.

10. A method for operating a memory system, the memory system comprising a plurality of super block groups, each super block group including plural memory blocks dispersed in a plurality of dies, and a controller coupled to the plural dies through a plurality of channels, the method comprising:
  determining which memory block in a first die among the plurality of dies is a bad block;
  determining a reserved memory block which is replaced with the bad block; and
  replacing the reserved memory block with the bad block in the first die,
  wherein the determining which reserved memory block is replaced includes searching for the reserved memory block in a second die among the plurality of dies, wherein the first die and the second die are coupled to the controller via different channels and belong to different super block groups.

11. The method according to claim 10, wherein each channel connects at least two dies among the plurality of dies to the controller, and each of chip enable pins is assigned to the at least two dies.

12. The method according to claim 11, wherein plural data input/output operations are performed in parallel based on each of chip enable pins.

13. The method according to claim 11, wherein, when a die among the at least two dies is in a busy state, another die among the at least two dies is in an idle state.

14. The method according to claim 10, further comprising:
  performing plural data input/output operations to a super block group including the reserved memory block.

15. The method according to claim 10, further comprising:
  storing information regarding the plurality of super block groups in a memory.

16. The method according to claim 10, wherein the determining which memory block is the bad block includes periodically monitoring whether a bad block occurs.

17. The method according to claim 10, wherein each die among the plurality of dies includes a plurality of planes, each plane including at least two memory blocks.

18. The method according to claim 17, wherein the plural memory blocks included in each super block group are located at a same offset in each die before any memory block of the plural memory blocks is replaced with the reserved memory block.

19. The method according to claim 18, wherein the reserved memory block and the bad block are located at different offsets in different dies.

20. A controller for managing memory blocks, the controller coupled to a plurality of dies through a plurality of channels, wherein the controller is configured to organize a plurality of super block groups, each super block group including plural memory blocks dispersed in the plurality of dies, determine which memory block in a first die among the plurality of dies is a bad block, determine a reserved memory block which is replaced with the bad block, and replace the reserved memory block with the bad block in the first die, wherein the controller is further configured to search for the reserved memory block in a second die among the plurality of dies, wherein the first die and the second die are coupled to the controller via different channels and belong to different super block groups.

* * * * *